(12) United States Patent　(10) Patent No.: US 10,224,085 B2
Gaudin et al.　(45) Date of Patent: Mar. 5, 2019

(54) MAGNETIC MEMORY CELL WITH ASYMMETRICAL GEOMETRY PROGRAMMABLE BY APPLICATION OF CURRENT IN THE ABSENCE OF A MAGNETIC FIELD

(71) Applicants: Centre National de la Recherche Scientifique, Paris (FR); Commissariat à l'Énergie Atomique et aux Énergies Alternatives, Paris (FR)

(72) Inventors: Gilles Gaudin, Le Sappey en Chartreuse (FR); Ioan Mihai Miron, Grenoble (FR); Olivier Boulle, Grenoble (FR); Safeer Chenattukuz Hiyil, Grenoble (FR); Jean-Pierre Nozieres, Le Sappey en Chartreuse (FR)

(73) Assignees: Centre National de la Recherche Scientifique, Paris (FR); Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/540,159

(22) PCT Filed: Jan. 13, 2016

(86) PCT No.: PCT/FR2016/050058
§ 371 (c)(1),
(2) Date: Jun. 27, 2017

(87) PCT Pub. No.: WO2016/113503
PCT Pub. Date: Jul. 21, 2016

(65) Prior Publication Data
US 2018/0005677 A1　Jan. 4, 2018

(30) Foreign Application Priority Data
Jan. 14, 2015　(FR) ..................................... 15 50273

(51) Int. Cl.
*H01L 43/02*　(2006.01)
*G11C 11/16*　(2006.01)
(Continued)

(52) U.S. Cl.
CPC ............ *G11C 11/161* (2013.01); *G11C 11/16* (2013.01); *G11C 11/1673* (2013.01);
(Continued)

(58) Field of Classification Search
CPC ................................................... G11C 11/161
See application file for complete search history.

(56) References Cited

U.S. PATENT DOCUMENTS 5,532,643 A * 7/1996 Kuffner ................... H01P 5/187
　　　　　　　　　　　　　　　　　　　333/116
6,614,084 B1 * 9/2003 Cowburn ............... B82Y 10/00
　　　　　　　　　　　　　　　　　　　205/118
(Continued)

FOREIGN PATENT DOCUMENTS

EP　2278589 A1 *　1/2011　........... G11C 11/161
FR　2914482 A1　10/2008
(Continued)

OTHER PUBLICATIONS

Safeer et al. ("Spin-orbit torque magnetization switching controlled by geometry", University of Grenoble Alpes, France, published in Nature Nanotechnology, vol. 11, Feb. 2016).*
(Continued)

*Primary Examiner* — Anthan Tran
*Assistant Examiner* — Mushfique Siddique
(74) *Attorney, Agent, or Firm* — Wolf, Greenfield & Sacks, P.C.

(57) ABSTRACT

A memory slot including a pad formed of a stack of regions made of thin layers, including a first region made of a nonmagnetic conducting material; a second region made of
(Continued)

a magnetic material exhibiting a magnetization in a direction perpendicular to the principal plane of the pad; a third region made of a nonmagnetic conducting material of different characteristics to those of the first region; the pad resting on a conducting track adapted to cause the flow of a programming current of chosen sense, in which the pad has an asymmetric shape with respect to any plane perpendicular to the plane of the layers and parallel to the central axis of the track, and with respect to its barycenter.

14 Claims, 4 Drawing Sheets

(51) Int. Cl.
  *G11C 11/18* (2006.01)
  *H01L 27/22* (2006.01)
  *H01L 43/08* (2006.01)
  *H01L 43/10* (2006.01)
(52) U.S. Cl.
  CPC .......... *G11C 11/1675* (2013.01); *G11C 11/18* (2013.01); *H01L 27/222* (2013.01); *H01L 43/02* (2013.01); *H01L 43/08* (2013.01); *H01L 43/10* (2013.01)

(56) References Cited

U.S. PATENT DOCUMENTS

| | | | | |
|---|---|---|---|---|
| 6,798,691 | B1* | 9/2004 | Ounadjela | G11C 11/16 257/E43.004 |
| 6,833,573 | B1* | 12/2004 | Worledge | B82Y 25/00 257/295 |
| 7,189,583 | B2* | 3/2007 | Drewes | G11C 11/16 257/E21.665 |
| 7,545,602 | B1* | 6/2009 | McKinstry | B82Y 25/00 360/110 |
| 7,596,015 | B2* | 9/2009 | Kitagawa | B82Y 25/00 365/158 |
| 7,813,202 | B2* | 10/2010 | Rodmacq | H01F 10/3236 365/209 |
| 8,004,374 | B2* | 8/2011 | Carey | G11B 5/3166 333/201 |
| 8,031,519 | B2* | 10/2011 | Javerliac | G11C 5/063 365/171 |
| 8,102,703 | B2* | 1/2012 | Nozieres | G11C 11/161 365/158 |
| 8,198,919 | B1* | 6/2012 | Kozhanov | H01F 10/3254 326/104 |
| 8,559,214 | B2* | 10/2013 | Fukami | G11C 11/14 257/E29.323 |
| 8,767,453 | B2* | 7/2014 | Dieny | G11C 11/161 365/145 |
| 9,553,256 | B2* | 1/2017 | Hirohata | H01L 29/66984 |
| 2002/0036919 | A1* | 3/2002 | Daughton | B82Y 10/00 365/173 |
| 2003/0185050 | A1* | 10/2003 | Kishi | G11C 11/15 365/173 |
| 2005/0040433 | A1* | 2/2005 | Nozieres | B82Y 25/00 257/200 |
| 2005/0047206 | A1* | 3/2005 | Nozieres | B82Y 25/00 365/177 |
| 2006/0083057 | A1* | 4/2006 | Nakayama | H01L 43/08 365/171 |
| 2006/0291276 | A1* | 12/2006 | Nozieres | G11C 11/16 365/158 |
| 2008/0084724 | A1* | 4/2008 | Nozieres | G11C 15/02 365/50 |
| 2008/0247072 | A1* | 10/2008 | Nozieres | G11C 11/16 360/59 |
| 2008/0308844 | A1* | 12/2008 | Koo | G11C 11/16 257/192 |
| 2009/0174016 | A1* | 7/2009 | Tanizaki | H01L 27/228 257/421 |
| 2009/0290413 | A1* | 11/2009 | Prejbeanu | G11C 11/155 365/171 |
| 2010/0027330 | A1* | 2/2010 | Koo | G11C 11/18 365/170 |
| 2010/0246254 | A1* | 9/2010 | Prejbeanu | G11C 11/1675 365/171 |
| 2010/0328808 | A1* | 12/2010 | Nozieres | G11C 11/16 360/59 |
| 2011/0007561 | A1* | 1/2011 | Berger | G11C 11/16 365/171 |
| 2011/0013448 | A1* | 1/2011 | Nozieres | G11C 11/161 365/173 |
| 2012/0018822 | A1* | 1/2012 | Gaudin | B82Y 25/00 257/421 |
| 2012/0020152 | A1* | 1/2012 | Gaudin | G11C 11/18 365/171 |
| 2012/0074510 | A1* | 3/2012 | Sasaki | G01R 33/093 257/422 |
| 2012/0098077 | A1* | 4/2012 | Gaudin | H01F 10/325 257/421 |
| 2012/0211848 | A1* | 8/2012 | Sasaki | H01L 43/08 257/422 |
| 2013/0134970 | A1* | 5/2013 | Schuhl | G01R 33/0005 324/252 |
| 2013/0285176 | A1* | 10/2013 | Suzuki | H01L 43/02 257/421 |
| 2013/0343118 | A1* | 12/2013 | Kim | G11C 11/161 365/158 |
| 2014/0010004 | A1* | 1/2014 | Suzuki | H01L 27/228 365/158 |
| 2014/0056060 | A1* | 2/2014 | Khvalkovskiy | H01L 27/228 365/158 |
| 2015/0311901 | A1* | 10/2015 | Bromberg | H01L 43/08 326/38 |
| 2016/0125928 | A1* | 5/2016 | Pileggi | G11C 11/161 365/158 |
| 2016/0141333 | A1* | 5/2016 | Bandyopadhyay | H01L 27/222 365/158 |
| 2017/0302280 | A1* | 10/2017 | Vaysset | H01L 43/08 |

FOREIGN PATENT DOCUMENTS

| | | |
|---|---|---|
| FR | 2924851 A1 | 6/2009 |
| FR | 2963152 A1 | 1/2012 |
| FR | 2976113 A1 | 12/2012 |

OTHER PUBLICATIONS

"Barycenter." Merriam-Webster.com. Merriam-Webster, n.d. Web. Feb. 1, 2018, accessed online Feb 1, 2018.*
International Search Report for Application No. PCT/FR2016/050058 dated Apr. 7, 2016.
Written Opinion of the International Searching Authority for Application No. PCT/FR2016/050058 dated Apr. 7, 2016.

* cited by examiner

MAGNETIC MEMORY CELL WITH ASYMMETRICAL GEOMETRY PROGRAMMABLE BY APPLICATION OF CURRENT IN THE ABSENCE OF A MAGNETIC FIELD

CROSS-REFERENCE TO RELATED APPLICATIONS

This application is the national phase of International Application No. PCT/FR2016/050058, filed on Jan. 13, 2016, which claims priority to French Patent Application No. 15/50273, filed on Jan. 14, 2015, which applications are incorporated herein by reference to the maximum extent allowable.

BACKGROUND

The present invention relates to a magnetic memory cell, and more particularly to a magnetic memory cell of current-induced reversal type.

STATE OF THE ART

French patent application Nr. 2963152 describes a magnetic memory cell such as schematically shown in FIGS. 1A, 1B, and 2. FIGS. 1A and 1B respectively show a cross-section view and a perspective view of a magnetic memory cell such as described in relation with FIGS. 1c-1f, 2a-2b, and 3a-3d of French patent application Nr. 2963152. FIG. 2 is a simplified perspective view of this memory cell.

As illustrated in FIGS. 1A and 1B, the memory cell comprises, above a conductive track 1, a pad 3. Pad 3 comprises a stack of regions, each of which is formed of a portion of a thin layer or of a stack of a plurality of thin layers. Conductive track 1 is for example formed on a substrate 5 comprised of a silicon wafer coated with a silicon oxide layer and is connected between terminals A and B. The stack forming pad 3 successively comprises, from track 1, a region 10 made of a non-magnetic conductive material, a region 11 made of a magnetic material, a region 12 made of a non-magnetic material, a region 13 made of a magnetic material, and an electrode 14. The material of layer 12 may be conductive; it is preferably an insulating material, sufficiently thin to be crossed by electrons by tunnel effect. There is a structural difference between non-magnetic regions 10 and 12, in order to have an asymmetrical system in a direction orthogonal to the plane of the layers. Such a difference may in particular result from a difference in material, thickness, or growth mode between these layers.

Lists of materials capable of forming the various layers are given in the above-mentioned patent application. The magnetic materials of regions 11 and 13 are formed in conditions such that they have a magnetization directed orthogonally to the plane of the layers. The magnetic material of layer 13 is formed in conditions such that it keeps an intangible magnetization (trapped layer). Upper electrode layer 14 is connected to a terminal C.

The programming of the memory cell is performed by circulating a current between terminals A and B, while a horizontally-directed field H (parallel to the plane of the layers and to the direction of the current between terminals A and B) is applied. According to the relative directions of the current between terminals A and B and of field vector H, layer 11 is programmed so that its magnetization is directed upwards or downwards.

For the reading from the memory cell, a voltage is applied between terminal C and one or the other of terminals A and B. The resulting current between terminal C and one or the other of terminals A and B takes different values according to the relative direction of the magnetizations of layers 11 and 13: high value if the two magnetizations are in the same direction and low value if the two magnetizations are of opposite directions.

An important feature of the above-described memory cell is that its programming is only performed due to a current flowing between terminals A and B and to a magnetic field applied in the plane of the layers, parallel to the current. No current flows from terminal A or B to terminal C during the programming. This has the advantage of fully dissociating the memory cell read and write operations.

Various alternative embodiments are possible. Particularly, each previously-described layer may be formed of a stack of layers as known in the art to acquire the desired characteristics.

The portion of layer 10 of a non-magnetic conductive material may be omitted, provided for track 1 to be made of a non-magnetic material appropriate for the growth of magnetic layer 11. Track 1 may then exhibit an overthickness under pad 3. For the reversal of the magnetization in layer 11 to be possible, spin-orbit couples should also be present in the magnetic layer. To achieve this, the layer in contact with layer 11 (or separated therefrom by a thin separation layer) should for example be made of a material or made up of materials having a strong spin-orbit coupling. Another solution for example is for the contact between magnetic layer 11 and one or the other of layers 10 and 12 to create the spin-orbit coupling; this is what may for example occur by hybridization of magnetic layer 11 with layer 12 if the latter is made of an insulator (see "Spin-orbit coupling effect by minority interface resonance states in single-crystal magnetic tunnel junctions", Y. Lu et al. Physical Review B, Vol. 86, p. 184420 (2012)).

It should be noted that the memory cell of FIGS. 1A and 1B may be broken up into two elements: a storage element comprising track 1 provided with terminals A and B and layer portions 10, 11, and 12, and a readout element comprising, in the example given hereabove, layers 13 and 14 and electrode C. With the same storage element, various readout modes may be envisaged, for example, an optical readout.

FIG. 2 shows a simplified perspective view of the memory cell of FIG. 1B. Only track 1 and layer stack or pad 3 are shown, as well as electrodes A and B connected to contacts 20 and 21.

As previously indicated, the memory cell is programmable by application of a current between terminals A and B simultaneously to the application of a magnetic field having a non-zero component along the direction of the current. Examples of magnetic field generation means are given in the above-mentioned patent application. The application of an external field or the forming of specific magnetic layers capable of creating field H raises practical implementation issues.

SUMMARY

An object of the present application is to provide a magnetic memory cell of the same type as that previously described and where the memory cell programming is simplified.

More particularly, it is here provided for the memory cell to be programmable by the simple application of a current in the absence of a magnetic field.

To achieve this object, it is provided to replace the symmetrical pad described in the above-mentioned application with an asymmetrical pad. It can then be observed that the memory cell may be programmed by simple application of an electric current in the track having the memory pad resting thereon, in the absence of a magnetic field.

More particularly, a memory cell comprising a pad formed of a stack of regions in thin layers is here provided, which comprises: a first region made of a non-magnetic conductive material; a second region made of a magnetic material having a magnetization in a direction perpendicular to the main plane of the pad; a third region made of a non-magnetic conductive material having characteristics different from those of the first region; said pad resting on a conductive track capable of circulating a programming current of selected direction, wherein the pad has an asymmetrical shape, on the one hand with respect to any plane perpendicular to the plane of the layers and parallel to the central axis of the track, and on the other hand with respect to its barycenter, whereby the direction of the magnetization in the second layer is programmable by the circulation direction of said programming current, in the absence of an external magnetic field.

According to an embodiment, the first region corresponds to a portion of the track underlying the pad or to an overthickness of this underlying portion.

According to an embodiment, the pad has a triangular shape with a first side parallel to the direction of the programming current and two other sides for example forming an angle from ±20° to ±70° relative to the first side.

According to an embodiment, the pad has a triangular shape with rounded corners.

According to an embodiment, the pad only extends across a portion of the track width.

According to an embodiment, the second region comprises an alloy having a specific perpendicular magnetic anisotropy, that is, in particular, FePt, FePd, CoPt, or also a rare earth/transition metal alloy, particularly GdCo, TbFeCo.

According to an embodiment, the second region comprises a metal or an alloy having in the stack a perpendicular magnetic anisotropy induced by the interfaces, particularly Co, Fe, CoFe, Ni, CoNi.

According to an embodiment, at least the first region or the third region is conductive and is made of a non-magnetic material, such as Pt, W, Ir, Ru, Pd, Cu, Au, Bi, Hf, or of an alloy of these metals, or is formed of a stack of a plurality of layers of each of these metals.

According to an embodiment, the third region is made of a dielectric oxide such as SiOx, AlOx, MgOx, TiOx, TaOx, HfOx or of a dielectric nitride such as SiNx, BNx.

According to an embodiment, the thickness of the first and third regions is in the range from 0.5 to 200 nm, more particularly from 0.5 to 100 nm, and preferably smaller than 3 nm.

According to an embodiment, the third region is covered with a readout layer made of a magnetic material and with a readout electrode.

According to an embodiment, the thickness of the second region is smaller than 3 nm.

According to an embodiment, the first region is made of a conductive antiferromagnetic material.

According to an embodiment, the memory cell comprises a conductive buffer layer between the first region and the track.

According to an embodiment, the thickness of the first region made of an antiferromagnetic material is in the range from 1 to 200 nm, and preferably smaller than 10 nm.

An embodiment provides a method of programming a memory cell such as hereabove, comprising the step of conducting in the track, and accordingly in the first region of antiferromagnetic material, a current having an intensity capable of heating the material to disorganize its magnetization, the direction of the current being selected to program the magnetization of the material in the storage layer according to a desired direction.

BRIEF DESCRIPTION OF THE DRAWING

The foregoing and other features and advantages will be discussed in detail in the following non-limiting description of dedicated embodiments in connection with the accompanying drawings, among which.

For clarity, the same elements have been designated with the same reference numerals in the various drawings and, further, as usual in the representation of integrated components, the various drawings are not to scale.

DETAILED DESCRIPTION

Figure 3:
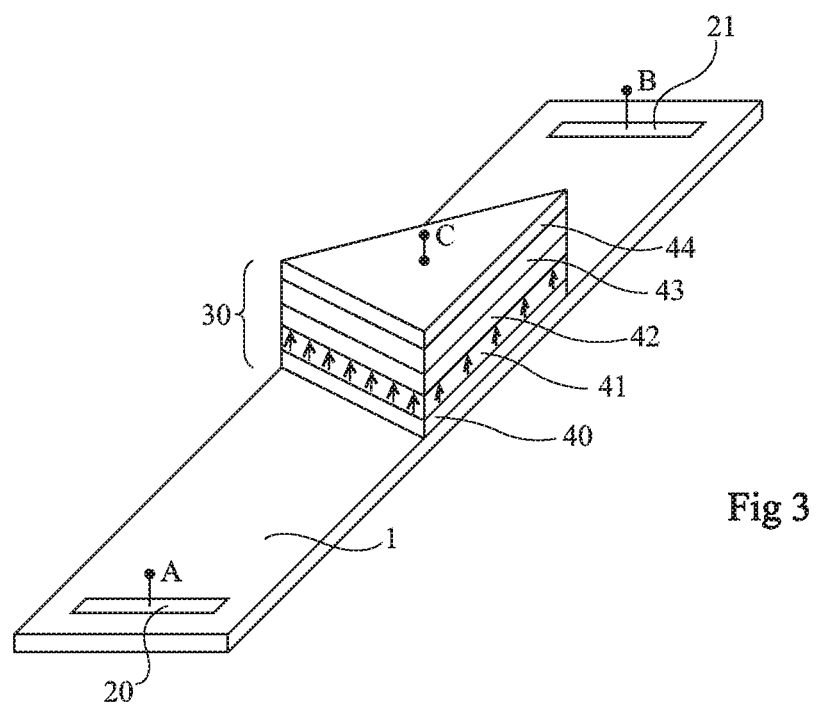
FIG. 3 is a simplified perspective view of an embodiment of a memory cell.

As shown in FIG. 3, an embodiment of a memory cell comprises a pad 30 integrally arranged on a conductive track 1 comprising, at its ends, connection layers 20 and 21 connected to terminals A and B. Pad 30 comprises the same stack of layers as previously-described pad 3. Thus, pad 30 comprises a region 40 made of a non-magnetic conductive material, a region 41 made of a magnetic material, a region 42 made of a non-magnetic material, region 42 exhibiting a difference with respect to region 40, a region 43 made of a magnetic material, and an electrode 44. The same variations as those described hereabove and in the above-mentioned French patent application apply.

Figure 1A:
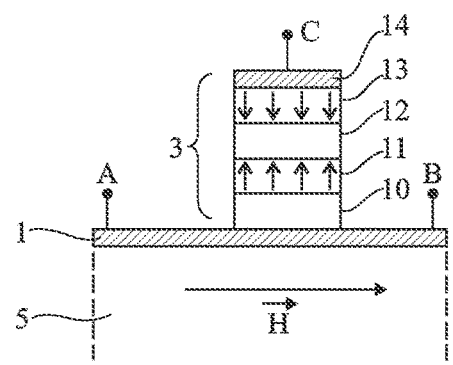
FIGS. 1A, 1B, and 2 are simplified representations of a memory cell such as described in French patent application Nr. 2963152.
Figure 1B:
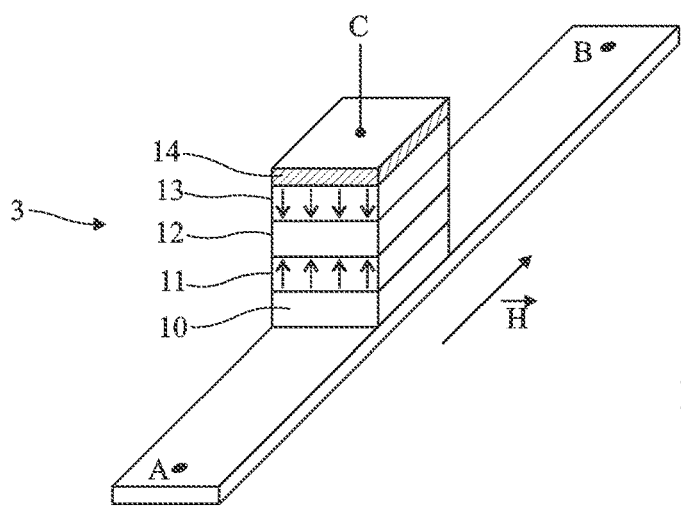
Figure 2:
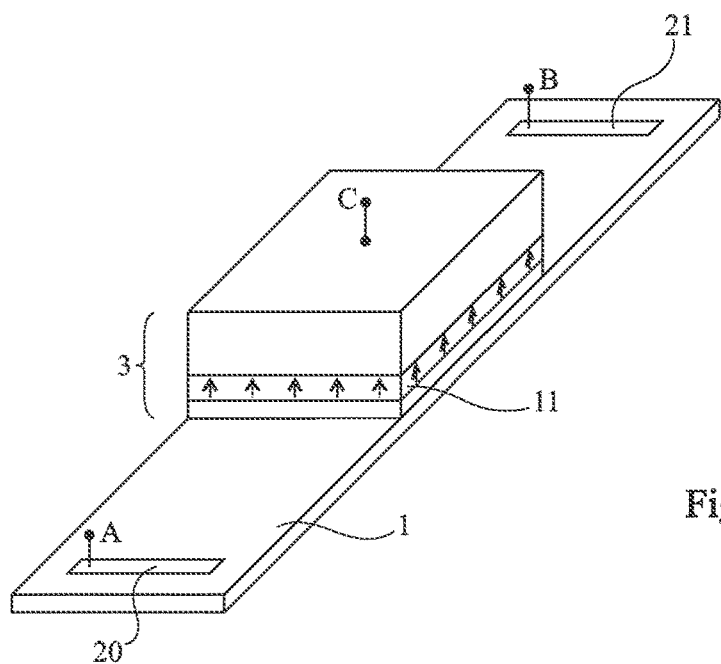

Unlike pad 3 of FIG. 2, pad 30 has a doubly asymmetrical configuration. On the one hand, it is asymmetrical with respect to any plane perpendicular to the plane of the layers and parallel to the central axis of track 1. On the other hand, it is asymmetrical with respect to its barycenter, which corresponds to point C in FIG. 3. As can be better seen in the top view of FIG. 4, this pad for example has a triangular shape. A first side is parallel to the direction of the programming current (from A to B). The two other sides for example form an angle in the range from ±20° to ±70° and preferably from ±30° to ±60° relative to the first side. Due to the photolithography defects, the corners of the triangle will generally be rounded. It may be intentionally desired to obtain such a rounded shape.

It has been observed that with a pad having such doubly asymmetrical shape (with respect to a plane and with respect to its barycenter) and integrally arranged on a track, the application of a programming current between terminals A and B flowing in the track under the pad and around the pad is sufficient to program layer 41 so that its magnetization is directed upwards or downwards according to the direction of the programming current. This is done with no application of an external magnetic field. Of course, if a conductive region 40 is provided, its resistivity and that of track 1 are selected so that a significant portion of the current between terminals A and B flows through region 40. It should be reminded that if track 1 is made of a non-magnetic material, region 40 may correspond to the track portion underlying the pad or to an overthickness of this region.

FIGS. 5A to 5J show as an example various shapes of asymmetrical pads which may be used on a track 1. These drawings will be considered as incorporated herein by reference.

Figure 4:
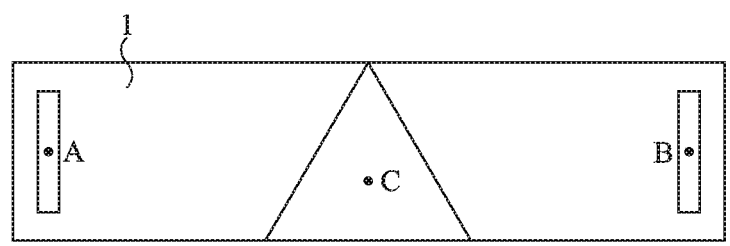
FIG. 4 is a simplified top view of the pad of FIG. 3.
Figure 5:
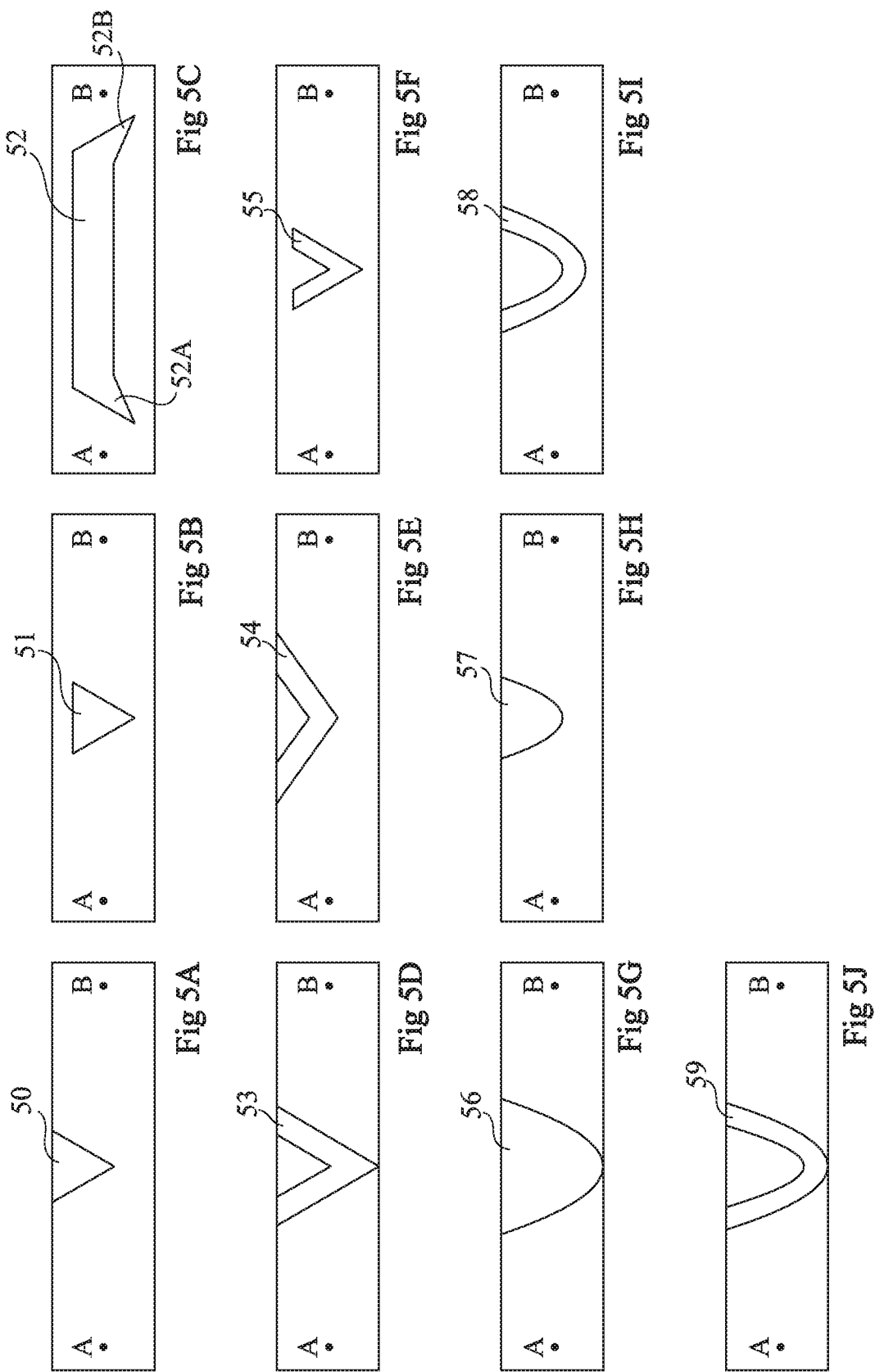
FIGS. 5A to 5J are simplified top views of contours of various embodiments of a memory cell.

Pads 50 and 51 of FIGS. 5A and 5B have triangle shapes like the pad of FIG. 4, but with different proportions and centers.

Pad 52 of FIG. 5C has the shape of a crescent elongated in the track direction. In other words, pad 52 has a trapezoidal shape provided with two tapered protrusions 52A and 52B at the ends of the base of the trapeze. It is now considered that the presence of the tapered protrusions eases the triggering of the reversal of the magnetization at the passing of the programming current.

Pads 53 to 55 of FIGS. 5D to 5F have herringbone shapes, the tip of the herringbone being directed towards a side of track 1, the herringbones having various dimensions and positions relative to the track width.

Pads 56 to 59 of FIGS. 5G to 5J are pads in the shape of triangles and of herringbones with rounded corners.

The various shapes described hereabove may be combined and modified from the moment that the double asymmetry rule mentioned herein is respected. In particular, all the envisaged shapes may be "rounded" or only extend across a portion of the width of track 1.

As concerns the materials and the thicknesses of the various regions of the pad, reference may be made to the above-mentioned French patent application.

As an example:
- the magnetic region (41) may comprise an alloy having a specific perpendicular magnetic anisotropy, that is, in particular, FePt, FePd, CoPt, or also a rare earth/transition metal alloy, particularly GdCo, TbFeCo.
- the magnetic region (41) may comprise a metal or an alloy having in the stack a perpendicular magnetic anisotropy induced by the interfaces, particularly Co, Fe, CoFe, Ni, CoNi,
- at least region (40) or region (42) may be conductive, made of a non-magnetic material, such as Pt, W, Jr, Ru, Pd, Cu, Au, Bi, Hf, or of an alloy of these metals, or in the form of a stack of a plurality of layers of each of these metals,
- region (42) may be made of a dielectric oxide such as SiOx, AlOx, MgOx, TiOx, TaOx, HfOx or of a dielectric nitride such as SiNx, BNx, having a thickness capable of allowing a tunnel effect,
- the thickness of one of the regions (40) and (42) may be in the range from 0.5 nm to 200 nm, more particularly from 0.5 nm to 100 nm, and preferably smaller than 3 nm,
- the upper region (42) may be covered with a readout layer (43) made of a magnetic material, or of a compound of magnetic materials, or of a plurality of layers of magnetic and non-magnetic materials, and with a read electrode (44), and
- the thickness of the magnetic region may be smaller than 3 nm.

In top view, the lateral dimensions of the pad may be in the range from 10 to 100 nm.

The above-described memory cells may be assembled in a memory array, as described in the above-mentioned French patent application.

Embodiment with a High Thermal Stability

The previously-described memory cells have satisfactory operations. However, to avoid having an excessive intensity of the current necessary for the programming, storage layers which are as thin as possible should be provided. Storage layers having a thickness smaller than 3 nanometers, and even having, for example, a thickness smaller than one nanometer, can thus be formed. Such a thickness decrease favors the decrease in the intensity of the programming current but results in a lack of stability of the memory cells. Indeed, memory cells comprising such a thin storage layer, risk incidentally switching state, particularly due to disturbances such as thermal agitation or parasitic magnetic fields. Thus, such memory cells have, in average, a limited thermal stability, which leads to providing a periodic reprogramming thereof.

To overcome this disadvantage, it is provided to couple the magnetic, generally ferromagnetic, storage region with a region of an antiferromagnetic material.

Figure 6:
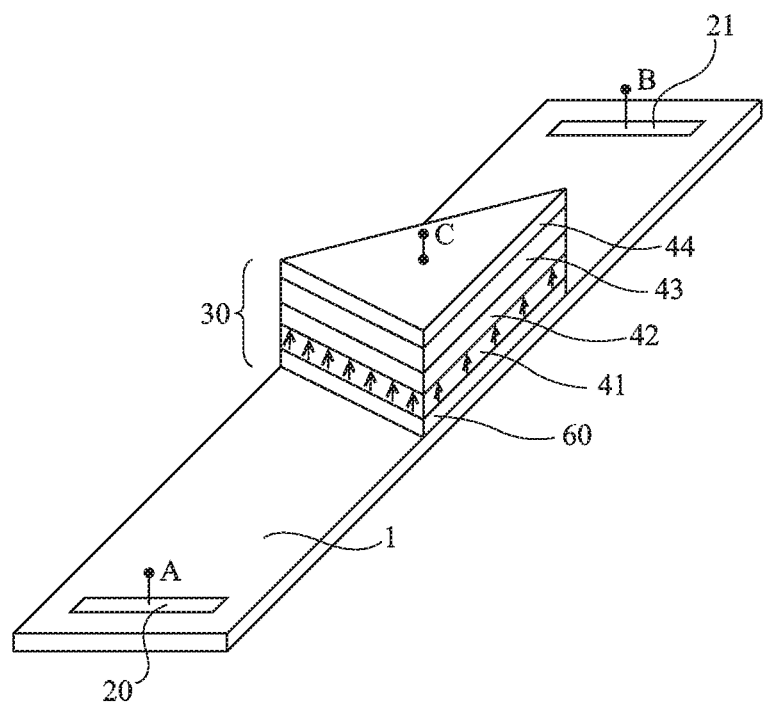
FIG. 6 is a simplified perspective view of another embodiment of a memory cell.

FIG. 6 shows an embodiment of a memory cell having an increased thermal stability, corresponding to the embodiment of FIG. 3. In FIG. 6, non-magnetic conductive layer 40 of FIG. 3 is replaced with a conductive layer 60 made of an antiferromagnetic material. The antiferromagnetic material couples by exchange interaction with the magnetic, for example, ferromagnetic, material of storage layer 41. This enables to trap the magnetization of this magnetic layer and to provide a thermal stability.

This structure is likely to have a number of variations. Particularly, a conductive buffer sub-layer (not shown), particularly intended to enable to satisfactorily deposit antiferromagnetic material layer 60, may be provided under antiferromagnetic material layer 60. Further, a thin layer of a non-magnetic conductive material, for example, copper, may be arranged between the ferromagnetic and antiferromagnetic regions to decrease, if need be, the coupling between these regions.

Figure 7:
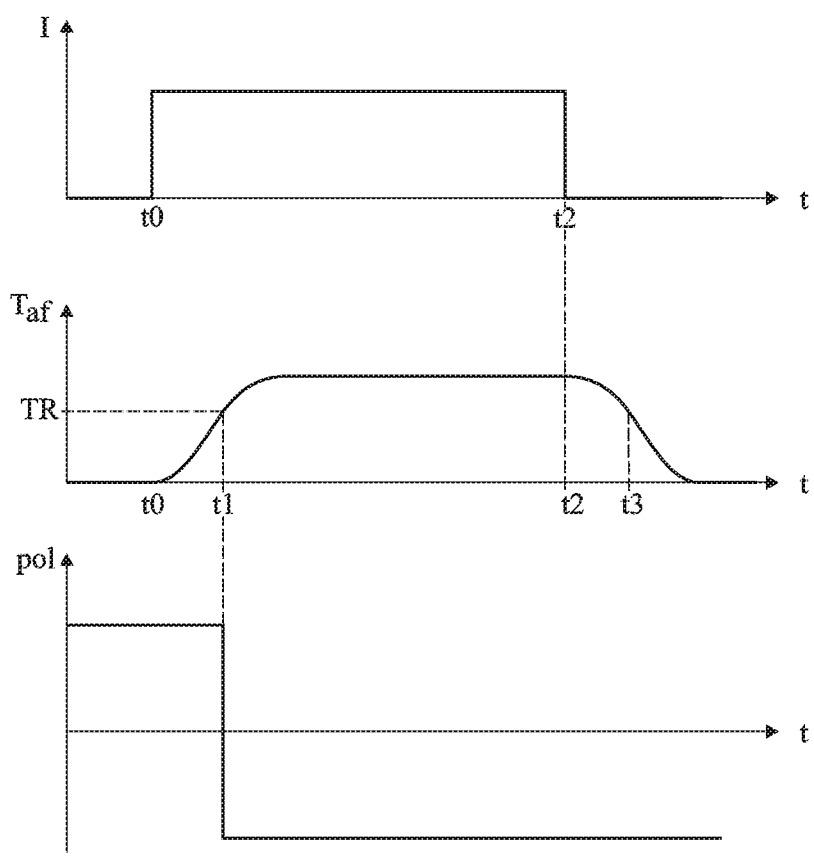
FIG. 7 shows various curves illustrating the operation of the memory cell of FIG. 6.

As illustrated in the curves of FIG. 7, the memory cell programming is carried out as follows. From a time t0, a current pulse I is sent between terminals A and B, the current having a direction capable of causing the reversal of the magnetization of magnetic layer 41. First, nothing occurs due to the coupling between magnetic and antiferromagnetic layers 41 and 60. However, temperature $T_{af}$ of the antiferromagnetic material increases by Joule effect and the magnetization organization of the material, whereby the coupling between magnetic materials and antiferromagnetic layers 41 and 60 decreases. From a time t1, the coupling becomes sufficiently low for magnetization "pol" of layer 41 to reverse under the effect of the portion of current I flowing through the ferromagnetic and antiferromagnetic layers of the pad. Once the current pulse between terminals A and B stops, at a time t2, temperature $T_{af}$ of the antiferromagnetic material decreases and the latter recovers, at a time t3, an organized state which couples back with the modified polarization of the magnetization in storage layer 41 and ensures its stability. To avoid possible write errors due to thermal agitation during the cooling of the memory cell, current I may be gradually decreased and controlled to control the temperature of the pad and the amplitude of the couples responsible for the reversal of the magnetization more independently. Current I will for example be gradually decreased over a time interval shorter than 1 µs, more particularly shorter than 100 ns, and preferably shorter than or equal to 10 ns.

A layer of antiferromagnetic material of a nature such that temperature TR for which the decrease of the exchange coupling with the magnetic layer, which enables the magnetization therein to be freer to reverse, is much higher than the temperatures of use provided for the operation of the memory cell or of the memory where the memory cell is incorporated, will be selected. Temperature TR is for example in the order of 140° C. for slow writing operations and in the range from 220 to 300° C. for fast writing operations.

As an example of antiferromagnetic materials which may be used herein, alloys such as for example those based on Mn such as IrMn, FeMn, PtMn, or alloys of these compounds such as PtFeMn, or also materials obtained by lamination of these compounds, or also oxides such as CoOx or NiOx may be mentioned, the magnetic material, preferably ferromagnetic, used for the storage layer then being a material such as previously described for layer 41. Generally, the electric conductivity of the antiferromagnetic material should be sufficient for current to flow therethrough during the write phase and any ferromagnetic material complying with this condition, coupling by exchange with the ferromagnetic material and having a blocking temperature in the range from 120 to 450° C., may be used.

Thus, the previously-described memory cell may be stabilized, even by providing a very thin magnetic layer, of a thickness smaller than 3 nm and preferably smaller than 1 nm. Antiferromagnetic material layer 60 will have a thickness in the range from 1 to 200 nm, more particularly from 1 to 50 nm, and preferably smaller than 10 nm. Such a thickness will depend on the material used, for example, in the order of 10 nm for FeMn, and in the range from 4 to 5 nm for IrMn. The time of reversal of such a magnetic cell may be very short. The current pulses I shown in FIG. 7 may for example have a duration shorter than 15 nanoseconds.

The invention claimed is:

1. A memory cell comprising a pad formed of a stack of regions in thin layers, comprising:
    a first region made of a conductive material;
    a second region made of a magnetic material having a magnetization in a direction perpendicular to the main plane of the pad;
    a third region of a non-magnetic material having characteristics different from those of the first region;
    said pad integrally resting on a conductive track capable of circulating a programming current of selected direction,
    wherein said pad has an asymmetrical shape, on the one hand with respect to any plane perpendicular to the plane of the layers and parallel to the central axis of the track, and on the other hand with respect to its barycenter,
    whereby the direction of the magnetization in the second region is programmable by the circulation direction of said programming current, in the absence of an external magnetic field, and
    wherein the pad has a triangular shape with a first side parallel to the direction of the programming current and two other sides, each forming an angle from ±20° to ±70° relative to the first side.

2. The memory cell of claim 1, wherein the first region corresponds to a portion of the track underlying the pad or to an overthickness of this underlying portion.

3. The memory cell of claim 1, wherein the pad has the triangular shape with rounded corners.

4. The memory cell of claim 1, wherein the pad only extends across a portion of the width of the track.

5. The memory cell of claim 1, wherein the second region comprises an alloy having a specific perpendicular magnetic anisotropy, that is FePt, FePd, CoPt, or a rare earth/transition metal alloy.

6. The memory cell of claim 1, wherein the second region comprises a metal or an alloy having in the stack a perpendicular magnetic anisotropy induced by the interfaces, particularly Co, Fe, CoFe, Ni, CoNi.

7. The memory cell of claim 1, wherein at least the first region or the third region is conductive and is made of a non-magnetic material selected among Pt, W, Ir, Ru, Pd, Cu, Au, Bi, Hf, or of an alloy of these metals, or is formed of a stack of a plurality of layers of each of these metals.

8. The memory cell of claim 1, wherein the third region is made of a dielectric oxide, selected among SiOx, AlOx, MgOx, TiOx, TaOx, HfOx, or of a dielectric nitride selected among SiNx, and BNx.

9. The memory cell of claim 1, wherein the thickness of the first and third regions is in the range from 0.5 to 200 nm.

10. The memory cell of claim 1, wherein the third region is covered with a readout layer made of a magnetic material and with a readout electrode.

11. The memory cell of claim 1, wherein the thickness of the second region is smaller than 3 nm.

12. The memory cell of claim 1, wherein the first region is made of a conductive antiferromagnetic material.

13. The memory cell of claim 12, wherein the thickness of the first region made of an antiferromagnetic material is in the range from 1 to 200 nm.

14. A method of programming the memory cell of claim 12, comprising the step of conducting in the track, and accordingly in the first region of antiferromagnetic material, a current having an intensity capable of heating the material to disorganize its magnetization, the direction of the current being selected to program the magnetization of the magnetic material of the second region.

* * * * *